United States Patent
Hendricks et al.

(10) Patent No.: US 6,610,145 B2
(45) Date of Patent: Aug. 26, 2003

(54) DEPOSITION OF NANOPOROUS SILICA FILMS USING A CLOSED CUP COATER

(75) Inventors: Neil Hendricks, Sonora, CA (US); Douglas M. Smith, Albuquerque, NM (US); Teresa Ramos, Albuquerque, NM (US); James Drage, Fremont, CA (US)

(73) Assignee: AlliedSignal Inc., Morristown, NJ (US)

( * ) Notice: Subject to any disclaimer, the term of this patent is extended or adjusted under 35 U.S.C. 154(b) by 0 days.

(21) Appl. No.: 09/956,361

(22) Filed: Sep. 19, 2001

(65) Prior Publication Data

US 2002/0019145 A1 Feb. 14, 2002

Related U.S. Application Data

(62) Division of application No. 09/360,131, filed on Jul. 23, 1999, now Pat. No. 6,335,296.
(60) Provisional application No. 60/095,573, filed on Aug. 6, 1998.

(51) Int. Cl.[7] .................................. B05C 11/02
(52) U.S. Cl. ..................... 118/52; 427/240; 427/425
(58) Field of Search .................. 118/52, 323, 326; 427/240, 425

(56) References Cited

U.S. PATENT DOCUMENTS

| | | | |
|---|---|---|---|
| 5,707,687 A | 1/1998 | Ueda et al. | 427/240 |
| 5,716,673 A | 2/1998 | Yen et al. | 427/240 |
| 5,803,970 A * | 9/1998 | Tateyama et al. | 118/319 |
| 6,048,804 A | 4/2000 | Smith et al. | 438/790 |

FOREIGN PATENT DOCUMENTS

| | | |
|---|---|---|
| EP | 0 461782 A2 | 5/1991 |
| EP | 0 775669 A2 | 11/1996 |
| WO | WO 92/03378 | 3/1992 |
| WO | WO 96/14164 | 5/1996 |
| WO | WO 98/49721 | 11/1998 |

* cited by examiner

Primary Examiner—Richard Crispino
Assistant Examiner—Michelle Lazor
(74) Attorney, Agent, or Firm—Roberts & Mercanti, LLP

(57) ABSTRACT

A process for forming a uniform nanoporous dielectric film on a substrate. The process includes horizontally positioning a flat substrate within a cup; depositing a liquid alkoxysilane composition onto the substrate surface; covering the cup such that the substrate is enclosed therein; spinning the covered cup and spreading the alkoxysilane composition evenly on the substrate surface; exposing the alkoxysilane composition to water vapor and base vapor to thereby form a gel; and then curing the gel. The invention also provides an apparatus for spin depositing a liquid coating onto a substrate. The apparatus has a cylindrical cup with an open top section and removable cover which closes the top. A vapor injection port extends through the center of the cover. Suitable means hold a substrate centered within the cup and spin the cup.

9 Claims, 2 Drawing Sheets

DEPOSITION OF NANOPOROUS SILICA FILMS USING A CLOSED CUP COATER

CROSS REFERENCE TO RELATED APPLICATION

This application claims the benefit of U.S. Provisional Patent Application Ser. No. 60/095,573 file Aug. 6, 1998.

This application is a division of U.S. patent application Ser. No. 09/360,131 filed on Jul. 23, 1999, which is now U.S. Pat. No. 6,335,296.

BACKGROUND OF THE INVENTION

1. Field of the Invention

The present invention relates to the production integrated circuits. More particularly, the invention relates to nanoporous dielectric coatings useful in the production of integrated circuits.

2. Description of Prior Art

It is known in the art that, in the production of integrated circuits, the problems of interconnect RC delay, power consumption and crosstalk become more significant as feature sizes approach 0.25 $\mu$m and below. It has been found that the use of low dielectric constant (K) materials for interlevel dielectric and intermetal dielectric applications partially mitigate these problems. However, each of the material candidates which are under consideration by the industry, having dielectric constants significantly lower than the currently employed dense silica, suffer from disadvantages. Most low dielectric constant materials developments use spin-on-glasses and fluorinated plasma chemical vapor deposition of $SiO_2$ with K of >3. Some organic and inorganic polymers have dielectric constants in the range of about 2.2 to 3.5, however, these polymers exhibit problems of low thermal stability, and poor mechanical properties including low glass transition temperature, and sample outgassing, thereby raising questions concerning their long term reliability questions.

Density, or its inverse, porosity, is the key parameter controlling property of importance for dielectrics. Higher porosity materials not only lead to a lower dielectric constant than dense materials, but they also allow additional components and processing steps to be introduced. As density decreases, dielectric constant and mechanical strength decrease, however the pore size increases. Important issues relating to porous materials include pore size; the strength decrease associated with porosity; and the role of surface chemistry on dielectric constant, loss and environmental stability.

One solution to these issues is the use of nanoporous silica, which can have dielectric constants in the range of about 1 to 3. Nanoporous silica is particularly attractive due to the ability to carefully control its pore size and pore distribution, and because it employs similar precursors such as tetraethoxysilane (TEOS), as is presently used for spin-on glass (SOG's), and CVD $SiO_2$. In addition to having low dielectric constants, nanoporous silica offers other advantages for microelectronics, including thermal stability up to 900° C.; small pore size (<< microelectronics features); use of materials, namely silica and its precursors, that are widely used in the semiconductor industry; the ability to tune dielectric constant over a wide range; and deposition using similar tools as employed for conventional spin-on glass processing. EP patent application EP 0 775 669 A2, which is incorporated herein by reference, shows a method for producing a nanoporous silica film with uniform density throughout the film thickness.

Nanoporous silica films are typically fabricated by methods such as dip-coating or spin-coating. When spin-coating, a mixture of a solvent and a silica precursor is deposited on a substrate wafer which is placed on a chuck in an open cup. The substrate is spun at several thousand rotations per minute (rpm's) in order to achieve a uniformly thin film on the substrate. Typically, the substrate is open to the atmosphere such that excess fluid can be flung from the substrate edge. However, turbulence around the substrate often results in a film which is not completely uniform, and which may vary in thickness. Turbulence is believed to cause defects such as striations, which are thickness gradients in the deposited film that are started at the center of the substrate and spiral radially outward to the edge of the substrate. This can cause a film to be non-uniform.

The present invention offers a solution to these problems. It has been unexpectedly found that using a closed cup when spin-coating will reduce turbulence around the substrate and result in a more uniform film. According to the present invention, a cover is placed over the substrate wafer so that the cup, cover, and substrate spin simultaneously. This simultaneous spinning eliminates turbulence that is normally found in traditional spin coating processes where only the substrate spins and the cup is stationary. Subsequently, vapors of water and a base such as ammonia are injected into the cover of the cup. Because of the lower turbulence due to the covering of the cup, the silica precursor is uniformly exposed to the vapors and is polymerized until it forms a gel. After this exposure, the substrate is ready for curing. Using this approach, a nanoporous silica film is obtained with uniform density and film thickness. In another embodiment of the invention, the precursor can be reacted with the base and water vapor after removal from the cup.

SUMMARY OF THE INVENTION

This invention provides a process for forming a nanoporous dielectric coating on a substrate which comprises:
  a) horizontally positioning a flat substrate within a cup;
  b) depositing a liquid alkoxysilane composition onto a surface of the substrate;
  c) covering the cup such that the substrate is enclosed therein;
  d) spinning the covered cup and spreading the alkoxysilane composition evenly on the substrate surface;
  e) exposing the alkoxysilane composition to sufficient water vapor, base vapor or both water vapor and base vapor to thereby form a gel; and
  f) curing the gel.

This invention further provides a semiconductor device produced by a process which comprises:
  a) horizontally positioning a flat semiconductor substrate within a cup;
  b) depositing a liquid alkoxysilane composition onto a surface of the substrate;
  c) covering the cup such that the substrate is enclosed therein;
  d) spinning the covered cup and spreading the alkoxysilane composition evenly on the substrate surface;
  e) exposing the alkoxysilane composition to sufficient water vapor, base vapor or both water vapor and base vapor to thereby form a gel; and
  f) curing the gel.

This invention still further provides an apparatus for spin depositing a liquid coating onto a substrate which comprises:

a) a cylindrical cup having an open top section;
b) a removable cover which engages with and closes the top section;
c) a vapor injection port extending through the center of the cover;
d) means for holding a substrate centered within the cup; and
e) means for spinning the cup.

DETAILED DESCRIPTION OF THE PREFERRED EMBODIMENT

Figure 1:
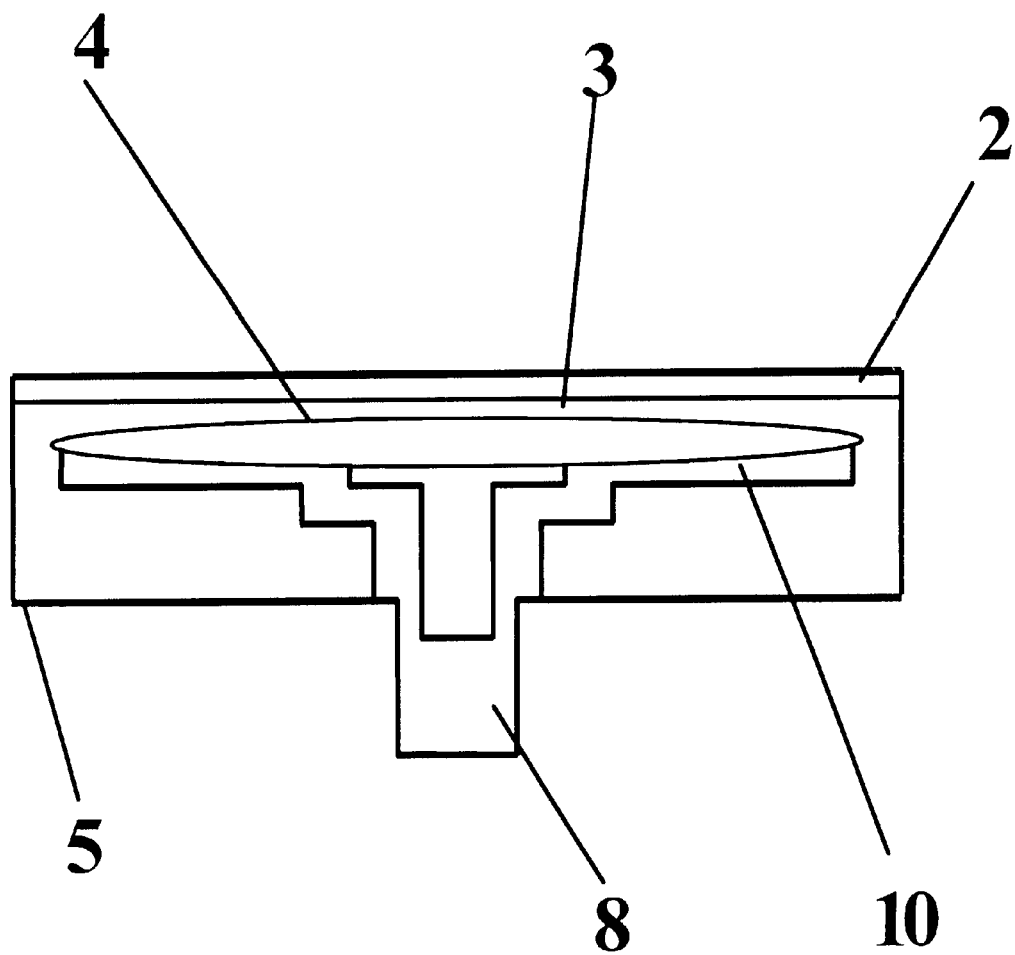
FIG. 1 shows a schematic representation of a closed rotary cup useful for the invention.

In the practice of the present invention, an alkoxysilane precursor composition is formed from at least one alkoxysilane and a solvent composition. A substrate wafer, optionally having a pattern of raised lines on its surface (as described below), is horizontally placed inside a coverable cup. Then the alkoxysilane precursor composition is applied onto the substrate. The cup is covered and spun to relatively uniformly apply a layer of the precursor composition onto the substrate. The precursor composition is then exposed to water vapor and base vapor. In one embodiment of the present invention, the water and base vapor are injected directly into the closed cup. In another embodiment, the coated substrate is exposed to the water and base vapor after the substrate is removed from the cup. Exposure to these vapors hydrolyzes and condenses the precursor composition until it forms a gel layer which is subsequently cured to form a nanoporous dielectric film on the surface of the substrate.

Useful alkoxysilanes for this invention include those which have the formula:

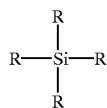

wherein at least 2 of the R groups are independently $C_1$ to $C_4$ alkoxy groups and the balance, if any, are independently selected from the group consisting of hydrogen, alkyl, phenyl, halogen, and substituted phenyl. For purposes of this invention, the term alkoxy includes any other organic group which can be readily cleaved from silicon at temperatures near room temperature by hydrolysis. R groups can be ethylene glycoxy or propylene glycoxy or the like, but preferably all four R groups are methoxy, ethoxy, propoxy or butoxy. The most preferred alkoxysilanes nonexclusively include tetraethoxysilane (TEOS) and tetramethoxysilane.

Preferably, the solvent composition comprises a relatively high volatility solvent or a relatively low volatility solvent or both a relatively high volatility solvent and a relatively low volatility solvent. The solvent, usually the higher volatility solvent, is at least partially evaporated immediately after deposition onto the substrate. This partial drying leads to better planarity due to the spinning of a lower viscosity material after the first solvent or parts of the solvent comes off. The more volatile solvent evaporates over a period of seconds or minutes. Slightly elevated temperatures may optionally be employed to accelerate this step. Such temperatures preferably range from about 20° C. to about 80° C., more preferably from about 20° C. to about 50° C. and most preferably from about 20° C. to about 35° C.

For purposes of this invention, a relatively high volatility solvent is one which evaporates at a temperature below, preferably significantly below, that of the relatively low volatility solvent. The relatively high volatility solvent preferably has a boiling point of about 120° C. or less, more preferably about 100° C. or less. Suitable high volatility solvents nonexclusively include methanol, ethanol, n-propanol, isopropanol, n-butanol and mixtures thereof. Other relatively high volatility solvent compositions which are compatible with the other ingredients can be readily determined by those skilled in the art.

The relatively low volatility solvent composition is one which evaporates at a temperature above, preferably significantly above, that of the relatively high volatility solvent. The relatively low volatility solvent composition preferably has a boiling point of about 175° C. or higher, more preferably about 200° C. or higher. Suitable low volatility solvent compositions nonexclusively include alcohols and polyols including glycols such as ethylene glycol, 1,4-butylene glycol, 1,5-pentanediol, 1,2,4-butanetriol, 1,2,3-butanetriol, 2-methyl-propanetriol, 2-(hydroxymethyl)-1,3-propanediol, 1,4,1,4-butanediol, 2-methyl-1,3-propanediol, tetraethylene glycol, triethylene glycol monomethyl ether, glycerol and mixtures thereof. Other relatively low volatility solvent compositions which are compatible with the other ingredients can be readily determined by those skilled in the art.

The alkoxysilane component is preferably present in an amount of from about 3% to about 50% by weight of the overall blend, more preferably from about 5% to about 45% and most preferably from about 10% to about 40%.

The solvent component is preferably present in an amount of from about 20% to about 90% by weight of the overall blend, more preferably from about 30% to about 70% and most preferably from about 40% to about 60%. When both a high and a low volatility solvent are present, the high volatility solvent component is preferably present in an amount of from about 20% to about 90% by weight of the overall blend, more preferably from about 30% to about 70% and a most preferably from about 40% to about 60% by weight of the overall blend. When both a high and a low volatility solvent are present, the low volatility solvent component is preferably present in an amount of from about 1 to about 40% by weight of the overall blend, more preferably from about 3% to about 30% and a most preferably from about 5% to about 20% by weight of the overall blend.

Typical substrates are those suitable to be processed into an integrated circuit or other microelectronic device. Suitable substrates for the present invention non-exclusively include semiconductor materials such as gallium arsenide (GaAs), silicon and compositions containing silicon such as crystalline silicon, polysilicon, amorphous silicon, epitaxial silicon, and silicon dioxide ($SiO_2$) and mixtures thereof. Lines may optionally be on the substrate surface. The lines, when present, are typically formed by well known lithographic techniques and may be composed of a metal, an oxide, a nitride or an oxynitride. Suitable materials for the lines include silica, silicon nitride, titanium nitride, tantalum nitride, aluminum, aluminum alloys, copper, copper alloys, tantalum, tungsten and silicon oxynitride. These lines form the conductors or insulators of an integrated circuit. Such are typically closely separated from one another at distances preferably of from about 20 micrometers or less, more preferably from about 1 micrometer or less, and most preferably of from about 0.05 to about 1 micrometer.

According to the invention, the alkoxysilane precursor composition is applied to the substrate surface and spun inside a closed cup. As can be seen in FIG. 1, a typical cup 5 is provided with a removable cover 2. Inside the cup 5, a substrate wafer 4 rests on a platform 10 which retains the substrate centered within the cup. The cup is connected to a rotor stem 8. The rotor stem 8 is then attached to a motor (not shown). In the practice of the present invention, a motor (not shown) rotates rotor stem 8. This rotation causes the cup 5, cover 2, and substrate 4 to spin, evenly distributing the silane precursor on the substrate 4. Another key feature of the design is the very small void space 3 (<5 mm) above the substrate 4 and below the cover 2. This void space minimizes the solvent evaporation during spin deposition to allow for a controlled solvent environment. This covered rotary cup design is preferably used to cause gelation of nanoporous silica films by injecting the water and base vapors before, during, or after spin deposition. Because of the lower turbulence, the film surface is uniformly exposed to the water vapor/base catalyst but because of the high substrate velocities, high mass transfer rates to the liquid precursor are achieved resulting in short reaction times. Therefore, directly after deposition and water/catalyst exposure, the substrate may be removed from the closed cup and processed through a conventional hot plate bake and cure procedure.

Figure 2:
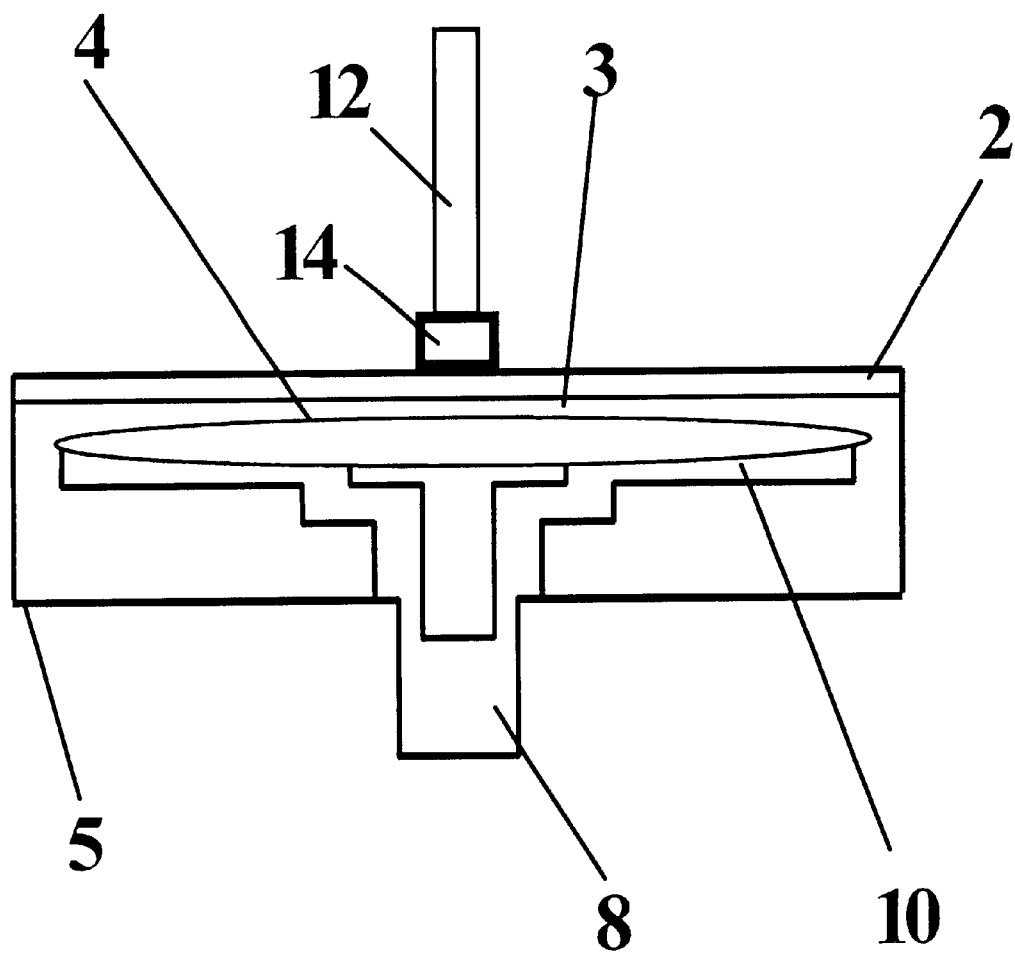
FIG. 2 shows schematic representations of an alternate embodiment of a closed rotary cup useful for the invention.

FIG. 2 shows another embodiment of the present invention. In FIG. 2, the cover 2 of cup 5 further comprises a vapor injection port which may comprise a tube 12 and a coupling 14 which are used to inject water vapor and/or base vapor into the cup. The injection port is mounted to the cover 2 via a coupling 14. In one embodiment, the tube 12 is removable from the coupling 14 and the injection port is sealed prior to spinning the substrate in the closed cup. In another embodiment, the tube and coupling are rotatably mounted to the cover 2 so that the tube and coupling remain stationary while the cup 5 and cover 2 are spun. This can be achieved by a variety of means such as mounting the coupling 14 to a track within the cover 2 of the cup in a tongue-in-groove arrangement. Suitable materials for the apparatus of the present invention nonexclusively include stainless steel, plastic, and the like. Stainless steel cups can be purchased from SEMIX, Inc. of Fremont, Calif., or from TEL America of Austin, Tex. Such may then be provided with the above described coupling arrangement.

As stated above, the coating is exposed to both a water vapor and a base vapor in the cup. The water vapor causes a continued hydrolysis of the alkoxysilane alkoxy groups, and the base catalyzes condensation of the hydrolyzed alkoxysilane and serves to increase molecular weight until the coating gels, and ultimately increases gel strength. Preferably, the coating is first exposed to a water vapor and then exposed to a base vapor, however, in an alternate embodiment, the coating may first be exposed to a base vapor and then a water vapor. For purposes of this invention, a base vapor includes gaseous bases.

The base is present in a catalytic amount which can be readily determined by those skilled in the art. Preferably the molar ratio of base to silane ranges from about 0 to about 0.2, more preferably from about 0.001 to about 0.05, and most preferably from about 0.005 to about 0.02. Water is included to provide a medium for hydrolyzing the alkoxysilane. The mole ratio of water to silane is preferably from about 0 to about 50, more preferably from about 0.1 to about 10 and a most preferably from about 0.5 to about 1.5.

In the preferred embodiment, the mole ratio of water vapor to base vapor preferably ranges from about 1:3 to about 1:100, more preferably from about 1:5 to about 1:50, and most preferably from about 1:10 to about 1:30.

In the preferred embodiment, the temperature of the water during the exposure preferably ranges from about 10° C. to about 60° C., more preferably from about 15° C. to about 50° C., and most preferably from about 20° C. to about 40° C. In the preferred embodiment, the temperature in the chamber after water exposure preferably ranges from about 10° C. to about 50° C., more preferably from about 15° C. to about 40° C., and most preferably from about 20° C. to about 40° C.

In the preferred embodiment, the temperature of the base during the exposure preferably ranges from about 10° C. to about 60° C., more preferably from about 15° C. to about 40° C., and most preferably from about 20° C. to about 30° C. In the preferred embodiment, the temperature after base exposure preferably ranges from about 10° C. to about 50° C., more preferably from about 15° C. to about 40° C., and most preferably from about 20° C. to about 40° C.

Suitable bases for use in the base vapor nonexclusively include ammonia and amines, such as primary, secondary and tertiary alkyl amines, aryl amines, alcohol amines and mixtures thereof which have a preferred boiling point of about 200° C. or less, more preferably 100° C. or less and most preferably 25° C. or less. Preferred amines are methylamine, dimethylamine, trimethylamine, n-butylamine, n-propylamine, tetramethyl ammonium hydroxide, piperidine and 2-methoxyethylamine. The ability of an amine to accept a proton in water is measured in terms of the basicity constant $K_b$, and $pK_b = -\log K_b$. In the preferred embodiment, the $pK_b$ of the base may range from about less than 0 to about 9, more preferably from about 2 to about 6 and most preferably from about 4 to about 5.

Once it forms into a gel, the film may be cured or dried in a conventional way by solvent evaporation of the less volatile solvent. Elevated temperatures may be employed to dry the coating in this step. Such temperatures preferably range from about 20° C. to about 450° C., more preferably from about 50° C. to about 350° C. and most preferably from about 175° C. to about 320° C.

As a result, a relatively high porosity, low dielectric constant, silicon containing polymer composition forms on the substrate. The silicon containing polymer composition preferably has a dielectric constant of from about 1.1 to about 3.5, more preferably from about 1.3 to about 3.0, and most preferably from about 1.5 to about 2.5. The pore size of silica composition preferably ranges from about 1 nm to about 100 nm, more preferably from about 2 nm to about 30 nm, and most preferably from about 3 nm to about 20 nm. The density of the silicon containing composition, including the pores, preferably ranges from about 0.1 to about 1.9 g/cm$^2$, more preferably from about 0.25 to about 1.6 g/cm$^2$, and most preferably from about 0.4 to about 1.2 g/cm$^2$.

The following nonlimiting examples serve to illustrate the invention.

EXAMPLE 1

This example demonstrates that the use of a rotary cup for spin coating can eliminate/minimize film non-uniformity's (i.e. radial striations).

The precursor is synthesized by adding 104.0 mL of tetraethoxysilane, 47.0 mL of triethylene glycol monomethyl ether, 8.4 mL of deionized water, and 0.34 mL of 1N nitric acid together in a round bottom flask. The solution is allowed to mix vigorously, and is then heated to ~80° C. and refluxed for 1.5 hours to form a solution. After the solution is allowed to cool, it is diluted 25% by weight with ethanol to reduce the viscosity. The diluted precursor is filtered to 0.1 μm using a teflon filter.

Two nanoporous silica films are processed in which the first is deposited using a rotary closed cup spin coater while the other is spun on a conventional coater. The first substrate wafer is spun on a rotary cup coater using the following process sequence: Open the cup and place substrate on a chuck. Deposit 2.0–10.0 ml of precursor and close the cup. Spin substrate and cup simultaneously to minimize the turbulence. Open the cup and spin at low rpm (<50 rpm) to allow for solvent evaporation. Continue processing the substrate. The second film is deposited on a conventional spin coater using the following process sequence. Place the substrate on the chuck. Deposit 2.0–10.0 ml of the precursor and spin at 2500 rpm for 30 seconds. Continue processing substrate.

The films are gelled and aged in a vacuum chamber using the following conditions. The chamber is evacuated to −20 inches of Hg. Next, 15M ammonium hydroxide is heated and equilibrated at 45° C. and dosed into the chamber to increase the pressure to −4.0 inches of Hg for 2–3 minutes. Finally, the chamber is evacuated to −20.0 inches of Hg and backfilled with nitrogen. The films are then solvent exchanged by which 25–50 mL of a 50/50 (by vol.) mixture of 3-pentanone and hexamethyldisilazane (Pacific Pac, Hollister, Calif. 95023) are spun on the film at 250 rpm's for 20 seconds without allowing the film to dry. The films are then spun dry at 1000 rpm for 5 seconds. The films are heated at elevated temperatures for 1 min. each at 175° C. and 320° C. in air. The films are characterized by ellipsometry to determine the refractive indices and thicknesses. In addition, the films are inspected using a light microscope at a magnification of 400× to observe for radial striations. The rotary closed cup processed film has no observed striations and has excellent thickness and refractive index uniformity while the regular deposited film shows some striations and poorer relative surface uniformity.

EXAMPLE 2

This example demonstrates that the use of a rotary cup for spin coating can improve global planarity on patterned substrates.

A precursor is synthesized by adding 104.0 mL of tetraethoxysilane, 47.0 mL of triethylene glycol monomethyl ether, 8.4 mL of deionized water, and 0.34 mL of 1N nitric acid together in a round bottom flask. The solution is allowed to mix vigorously, and is then heated to ~80° C. and refluxed for 1.5 hours to form a solution. After the solution is allowed to cool, it is diluted 25% by weight with ethanol to reduce the viscosity. The diluted precursor is filtered to 0.1 μm using a teflon filter.

Two nanoporous silica films are processed in which the first is deposited using a rotary cup spin coater while the other is spun on a conventional coater. The first substrate is spun on a rotary closed cup coater using the following process sequence. Open the cup and place the patterned substrate on the chuck. Deposit 2.0–10.0 ml of precursor using a static dispense and close the cup. Spin the film at 2–3 krpm for 30–180 seconds. Planarize the precursor by spinning at a very high rpm (~5 krpm). Open the cup and spin dry the substrate at a low rpm (<50 rpm) to allow for solvent evaporation. Continue processing the substrate. The second film is deposited on a conventional spin coater using the following process sequence: Place the patterned substrate on the chuck. Deposit 2.0–10.0 ml of the precursor and spin at 2500 rpm for 30 seconds. Continue processing substrate.

The films are gelled and aged in a vacuum chamber using the following conditions. The chamber is evacuated to −20 inches of Hg. Next, 15M ammonium hydroxide is heated and equilibrated at 45° C. and dosed into the chamber to increase the pressure to −4.0 inches Hg for 2–3 minutes. Finally, the chamber is evacuated to −20.0 inches of Hg and backfilled with nitrogen.

The films are then solvent exchanged by which 25–50 mL of a 50/50 (by vol.) mixture of 3-pentanone and hexamethyldisilazane are spun on the film at 250 rpm's for 20 seconds without allowing the film to dry. The films are then spun dry at 1000 rpm for 5 seconds.

The films are heated at elevated temperatures for 1 min. each at 175° C. and 320° C. in air. The films are inspected by cross-sectional SEM at a magnification of 5000–40000× to observe for global planarity. It is observed that the rotary closed cup film has relatively better global planarity while the regularly deposited film shows relatively poorer global planarity.

EXAMPLE 3

Example 1 is repeated except after precursor deposition, it is gelled and aged by first dosing water vapor into the closed cup. Thereafter, ammonium hydroxide vapor is dosed into the closed cup.

EXAMPLE 4

Example 1 is repeated except after precursor deposition, it is gelled and aged by first dosing ammonium hydroxide vapor into the closed cup. Thereafter, water vapor is dosed into the closed cup.

EXAMPLE 5

Example 1 is repeated except after precursor deposition, it is gelled and aged by dosing a mixture of water and ammonium hydroxide vapor into the closed cup.

The foregoing examples show that by using closed cup spin coating of a substrate with a nanoporous coating composition precursor, that films having improved planarity and striation characteristics are produced.

What is claimed is:

1. An apparatus for spin depositing a liquid coating onto a substrate which comprises:
   a) a cylindrical cup having an open top section;
   b) a removable cover which engages with and closes the top section, wherein a void space is located between the cover and a position for a substrate, wherein the void space is less than 5 mm;
   c) a vapor injection port extending through the center of the cover, wherein the vapor injection port comprises a coupling mounted with the cover, and a tube mounted to the coupling; which coupling is rotatably mounted to the cover such that the tube and coupling remain substantially stationary when the cover and cup are caused to spin;
   d) means for holding a substrate centered within the cup; and
   e) means for spinning the cup.

2. The apparatus of claim 1, wherein the vapor injection port comprises a tube and a coupling.

3. The apparatus of claim 1, wherein the vapor injection port comprises a tube and a coupling wherein the tube and coupling are rotatably mounted to the cover.

4. The apparatus of claim 1, wherein the vapor injection port: is mounted to the cover via a coupling.

5. The apparatus of claim 1, wherein the vapor injection port is mounted to the cover via a coupling and the coupling is mounted to a track within the cover of the cup in a tongue-in-groove arrangement.

6. The apparatus of claim 1, wherein the cup and cover comprises stainless steel or plastic.

7. The apparatus of claim 1, wherein the tube is removable from the coupling.

8. An apparatus for spin depositing a liquid coating onto a substrate which comprises:
   a) a cylindrical cup having an open top section;
   b) a removable cover which engages with and closes the top section;
   c) a vapor injection port extending through the center of the cover, wherein the vapor injection port is mounted to the cover via a coupling and the coupling is mounted to a track within the cover of the cup in a tongue-in-groove arrangement;
   d) means for holding a substrate centered within the cup; and
   e) means for spinning the cup.

9. An apparatus for spin depositing a liquid coating onto a substrate which comprises:
   a) a cylindrical cup having an open top section;
   b) a removable cover which engages with and closes the top section;
   c) a vapor injection port extending through the center of the cover, wherein the vapor injection port comprises a coupling mounted with the cover, and a tube mounted to the coupling; which coupling is rotatably mounted to the cover such that the tube and coupling remain substantially stationary when the cover and cup are caused to spin, and wherein the tube is removable from the coupling;
   d) means for holding a substrate centered within the cup; and
   e) means for spinning the cup.

* * * * *